(12) United States Patent
Lu et al.

(10) Patent No.: US 11,821,975 B2
(45) Date of Patent: Nov. 21, 2023

(54) RADAR MODULE INCORPORATED WITH A PATTERN-SHAPING DEVICE

(71) Applicant: MediaTek Inc., Hsin-Chu (TW)

(72) Inventors: Yen-Ju Lu, Hsin-Chu (TW); Chih-Ming Hung, San Jose, CA (US); Wen-Chou Wu, Hsin-Chu (TW)

(73) Assignee: MediaTek Inc., Hsin-Chu (TW)

( * ) Notice: Subject to any disclaimer, the term of this patent is extended or adjusted under 35 U.S.C. 154(b) by 0 days.

(21) Appl. No.: 17/495,769

(22) Filed: Oct. 6, 2021

(65) Prior Publication Data

US 2022/0026552 A1 Jan. 27, 2022

Related U.S. Application Data

(63) Continuation of application No. 16/143,470, filed on Sep. 27, 2018, now Pat. No. 11,169,250.

(Continued)

(51) Int. Cl.
| | |
|---|---|
| *G01S 13/02* | (2006.01) |
| *H01Q 15/14* | (2006.01) |
| *G01S 7/03* | (2006.01) |
| *H01Q 1/38* | (2006.01) |
| *H01Q 1/32* | (2006.01) |

(Continued)

(52) U.S. Cl.
CPC ............... *G01S 13/02* (2013.01); *G01S 7/03* (2013.01); *G01S 13/931* (2013.01); *H01L 23/12* (2013.01); *H01L 23/28* (2013.01); *H01Q 1/2283* (2013.01); *H01Q 1/245* (2013.01); *H01Q 1/3233* (2013.01); *H01Q 1/38* (2013.01); *H01Q 1/525* (2013.01); *H01Q 15/14* (2013.01); *H01Q 17/001* (2013.01); *H05K 1/0213* (2013.01); *G01S 7/027* (2021.05); *G01S 7/028* (2021.05)

(58) Field of Classification Search
CPC .......... G01S 13/02; G01S 7/03; G01S 13/931; H01L 23/12
USPC ............... 343/753; 342/42, 174, 36, 70, 368
See application file for complete search history.

(56) References Cited

U.S. PATENT DOCUMENTS

| | | |
|---|---|---|
| 3,243,706 A | 3/1966 | Grisham |
| 6,424,318 B1 * | 7/2002 | Bergstedt ............... H01Q 15/08 343/753 |

(Continued)

FOREIGN PATENT DOCUMENTS

| | | |
|---|---|---|
| CN | 101299487 A | 11/2008 |
| CN | 103779336 A | 5/2014 |

(Continued)

OTHER PUBLICATIONS

U.S. Appl. No. 16/143,470, filed Sep. 27, 2018, Lu et al.

*Primary Examiner* — Bo Fan
(74) *Attorney, Agent, or Firm* — Wolf, Greenfield & Sacks, P.C.

(57) ABSTRACT

A radar module includes a printed circuit board (PCB) and a semiconductor package mounted on the PCB. The semiconductor package comprises an integrated circuit die and a substrate for electrically connecting the integrated circuit die to the PCB. The substrate comprises an antenna layer integrated into the semiconductor package and electrically connected to the integrated circuit die for at least one of transmitting and receiving radar signals. A discrete pattern-shaping device is mounted on the PCB and is configured to shape a radiation pattern of the radar signals.

14 Claims, 16 Drawing Sheets

Related U.S. Application Data

(60) Provisional application No. 62/596,152, filed on Dec. 8, 2017, provisional application No. 62/577,745, filed on Oct. 27, 2017.

(51) Int. Cl.

| | | |
|---|---|---|
| *H01Q 1/52* | (2006.01) | |
| *G01S 13/931* | (2020.01) | |
| *H01Q 1/22* | (2006.01) | |
| *H01Q 17/00* | (2006.01) | |
| *H01L 23/12* | (2006.01) | |
| *H01L 23/28* | (2006.01) | |
| *H01Q 1/24* | (2006.01) | |
| *H05K 1/02* | (2006.01) | |
| *G01S 7/02* | (2006.01) | |

(56) References Cited

U.S. PATENT DOCUMENTS

| | | | |
|---|---|---|---|
| 6,770,955 B1 | 8/2004 | Coccioli et al. | |
| 9,972,917 B2* | 5/2018 | Vacanti | G01S 13/4463 |
| 10,106,323 B2* | 10/2018 | Terrill | B62B 3/06 |
| 11,169,250 B2 | 11/2021 | Lu et al. | |
| 2008/0283952 A1* | 11/2008 | Choi | H01L 27/14625 |
| | | | 257/E23.116 |
| 2010/0193935 A1* | 8/2010 | Lachner | H01L 24/12 |
| | | | 257/693 |
| 2016/0042621 A1 | 2/2016 | Hogg et al. | |
| 2016/0054439 A1* | 2/2016 | Brookner | G01S 13/91 |
| | | | 342/36 |
| 2016/0380711 A1* | 12/2016 | Feigin | H04B 1/40 |
| | | | 342/174 |
| 2019/0129023 A1 | 5/2019 | Lu et al. | |

FOREIGN PATENT DOCUMENTS

| | | |
|---|---|---|
| CN | 104730516 A | 6/2015 |
| CN | 105938934 A | 9/2016 |
| CN | 105993098 A | 10/2016 |
| CN | 206388860 U | 8/2017 |
| CN | 109244641 A | 1/2019 |
| EP | 1 357 395 A1 | 10/2003 |
| JP | 2001-004398 A | 1/2001 |
| TW | 200915658 A | 4/2009 |
| TW | 200933978 A | 8/2009 |
| TW | 201725693 A | 7/2017 |

\* cited by examiner

RADAR MODULE INCORPORATED WITH A PATTERN-SHAPING DEVICE

CROSS REFERENCE TO RELATED APPLICATIONS

This Application is a Continuation of U.S. application Ser. No. 16/143,470, filed Sep. 27, 2018, and entitled "RADAR MODULE INCORPORATED WITH A PATTERN-SHAPING DEVICE", which is a Non-Provisional of Provisional Application Ser. No. 62/596,152, filed Dec. 8, 2017 and Provisional Application Ser. No. 62/577,745, filed Oct. 27, 2017. The entire contents of each these applications is incorporated herein by reference in their entirety.

BACKGROUND

This disclosure relates generally to the field of a radar module and, more particularly, to a radar module incorporated with a pattern-shaping device.

As known in the art, a radar module such as a millimeter-wave (mmW) radar module for automotive applications typically includes an Antenna-in-Package (AiP) with an antenna assembly having a specific radiation pattern.

Sometimes, the radiation pattern of the fabricated AiP of a radar module may need to be shaped to meet another customer's gain pattern specification. However, once the AiP is fabricated, the radiation pattern thereof is fixed, and basically there is no way to adjust it except that the antenna assembly is redesigned.

This is undesirable because redesigning the antenna assembly is usually time-consuming and is also costly.

SUMMARY

The main object of the present invention is to provide a radar module incorporated with a pattern-shaping device to overcome the deficiencies and disadvantages of the prior art.

According to one aspect of the invention, a radar module includes a printed circuit board (PCB) having a first surface and a second surface opposite to the first surface. A semiconductor package is mounted on the PCB. The semiconductor package comprises an integrated circuit die and a substrate for electrically connecting the integrated circuit die to the PCB. The substrate comprises an antenna layer integrated into the semiconductor package and electrically connected to the integrated circuit die for at least one of transmitting and receiving radar signals. A pattern-shaping device is mounted on the first surface of the PCB and is configured to shape a radiation pattern of the radar signals.

According to another aspect of the invention, a radar module includes a printed circuit board (PCB) having a first surface and a second surface opposite to the first surface. A semiconductor package is mounted on the PCB. The semiconductor package comprises an integrated circuit die and a substrate for electrically connecting the integrated circuit die to the PCB. The substrate comprises an antenna layer integrated into the semiconductor package and electrically connected to the integrated circuit die for at least one of transmitting and receiving radar signals. A radar main body is provided to house the PCB and the semiconductor package. The radar main body may comprise a retainer. A pattern-shaping device is mounted on the retainer and is configured to shape a radiation pattern of the radar signals.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DETAILED DESCRIPTION

In the following detailed description of the invention, reference is made to the accompanying drawings which forma part hereof, and in which is shown, by way of illustration, specific embodiments in which the invention may be practiced. These embodiments are described in sufficient detail to enable those skilled in the art to practice the invention. Other embodiments may be utilized and structural, logical, and electrical changes may be made without departing from the scope of the present invention.

The terms "die", "chip", "semiconductor chip", and "semiconductor die" are used interchangeable throughout the specification to mean integrated circuit chip or die. The term "horizontal" as used herein may be defined as a direction parallel to a plane or surface (e.g., surface of a substrate or a stage), regardless of its orientation. The term "vertical," as used herein, may refer to a direction orthogonal to the horizontal direction as just described. Terms, such as "on," "above," "below," "bottom," "top," "side" (as in "sidewall"), "higher," "lower," "upper," "over," and "under," may be referenced with respect to the horizontal plane.

The present disclosure pertains to a radar module incorporated with a discrete pattern-shaping device, which is capable of providing benefits including, but not limited to, narrower beam width and higher gain. By incorporating various pattern-shaping structures, the customer's gain pattern specification can be met without the need of redesigning the antenna assembly of the Antenna-in-Package (AiP).

Figure 1:
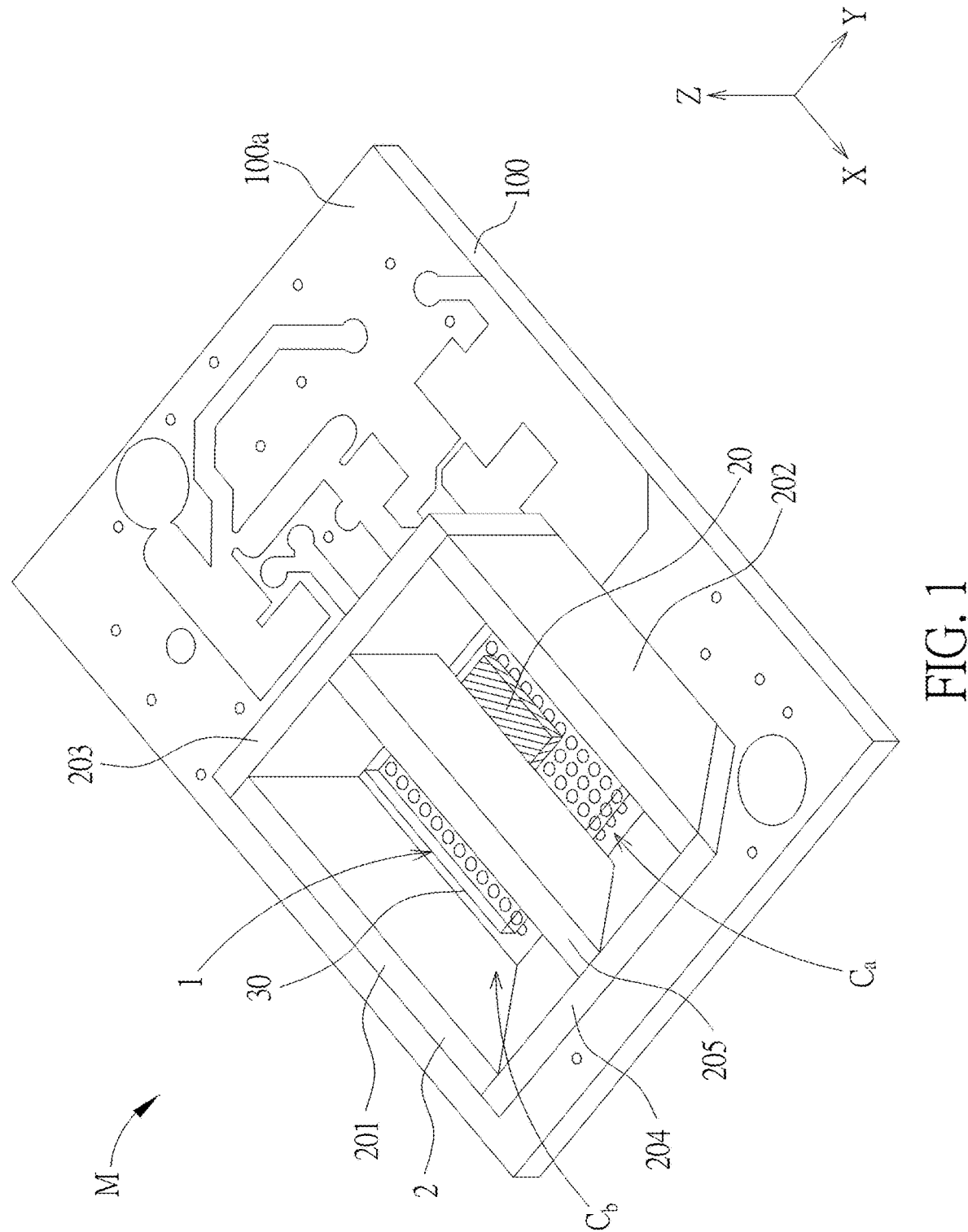
FIG. 1 is a perspective diagram of an exemplary radar module according to one embodiment of the invention.
Figure 2:
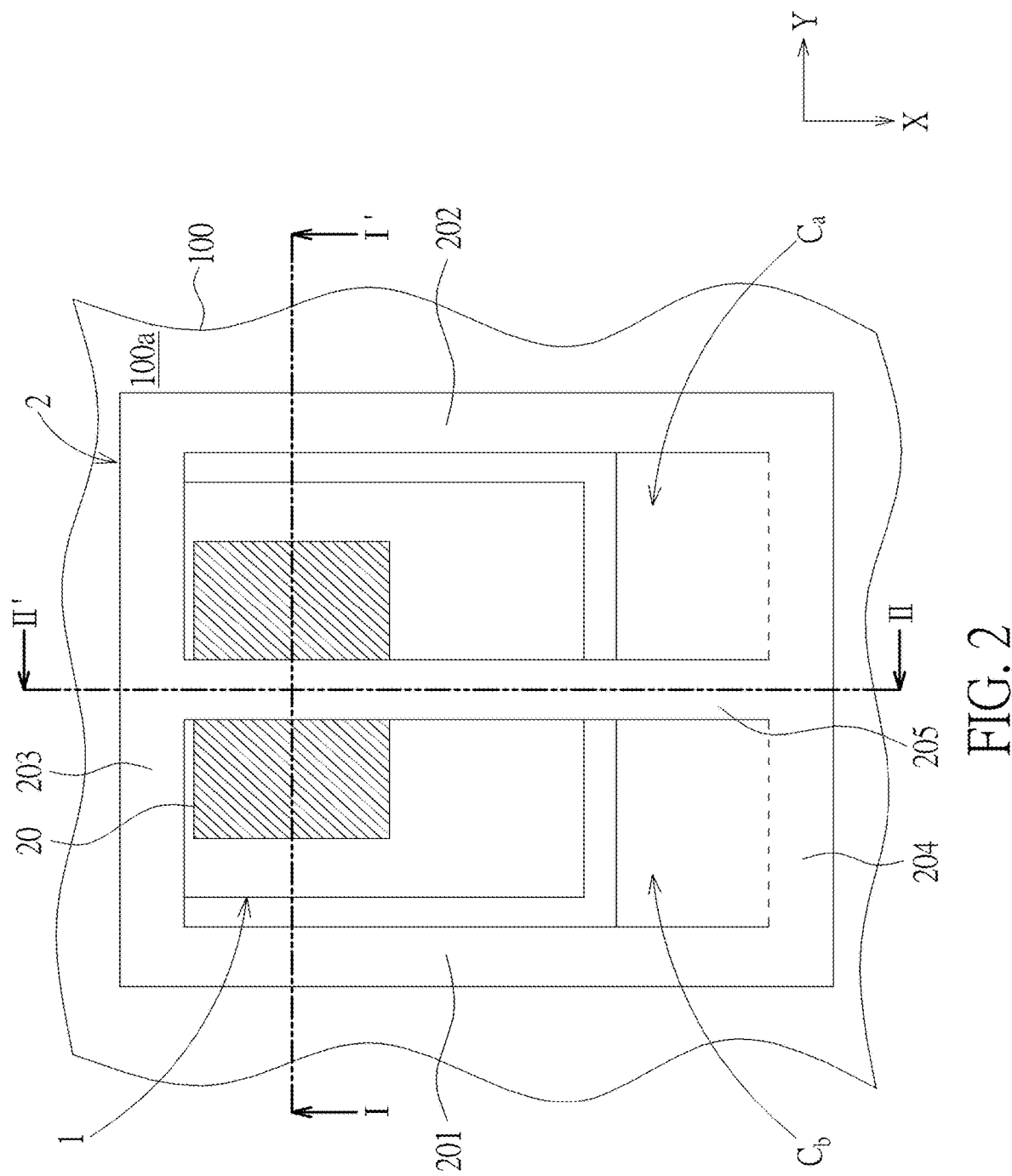
FIG. 2 is a top view of the exemplary radar module in FIG. 1.
Figure 3:
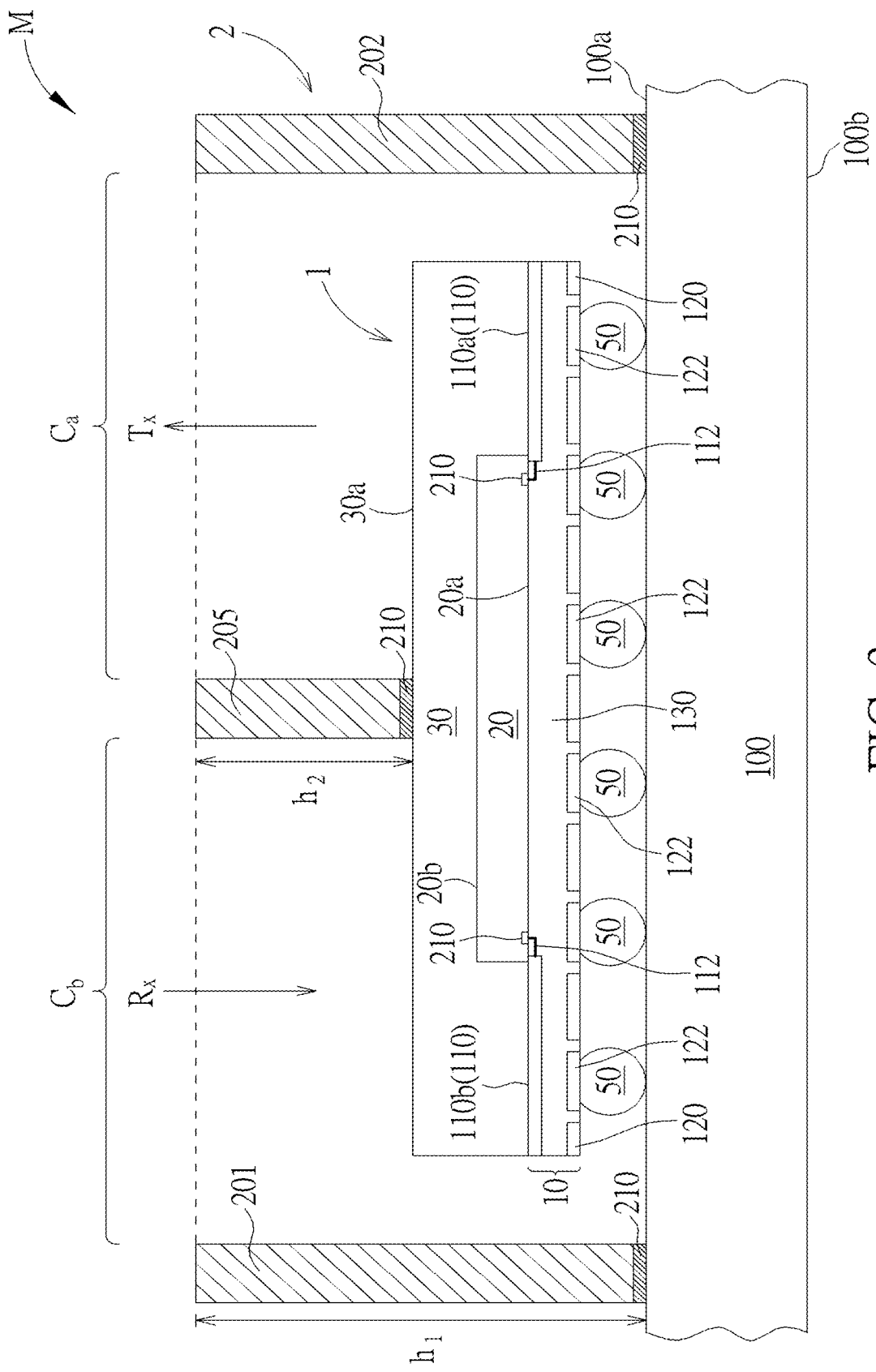
FIG. 3 is a schematic, cross-sectional view taken along line I-I' in FIG. 2.
Figure 4:
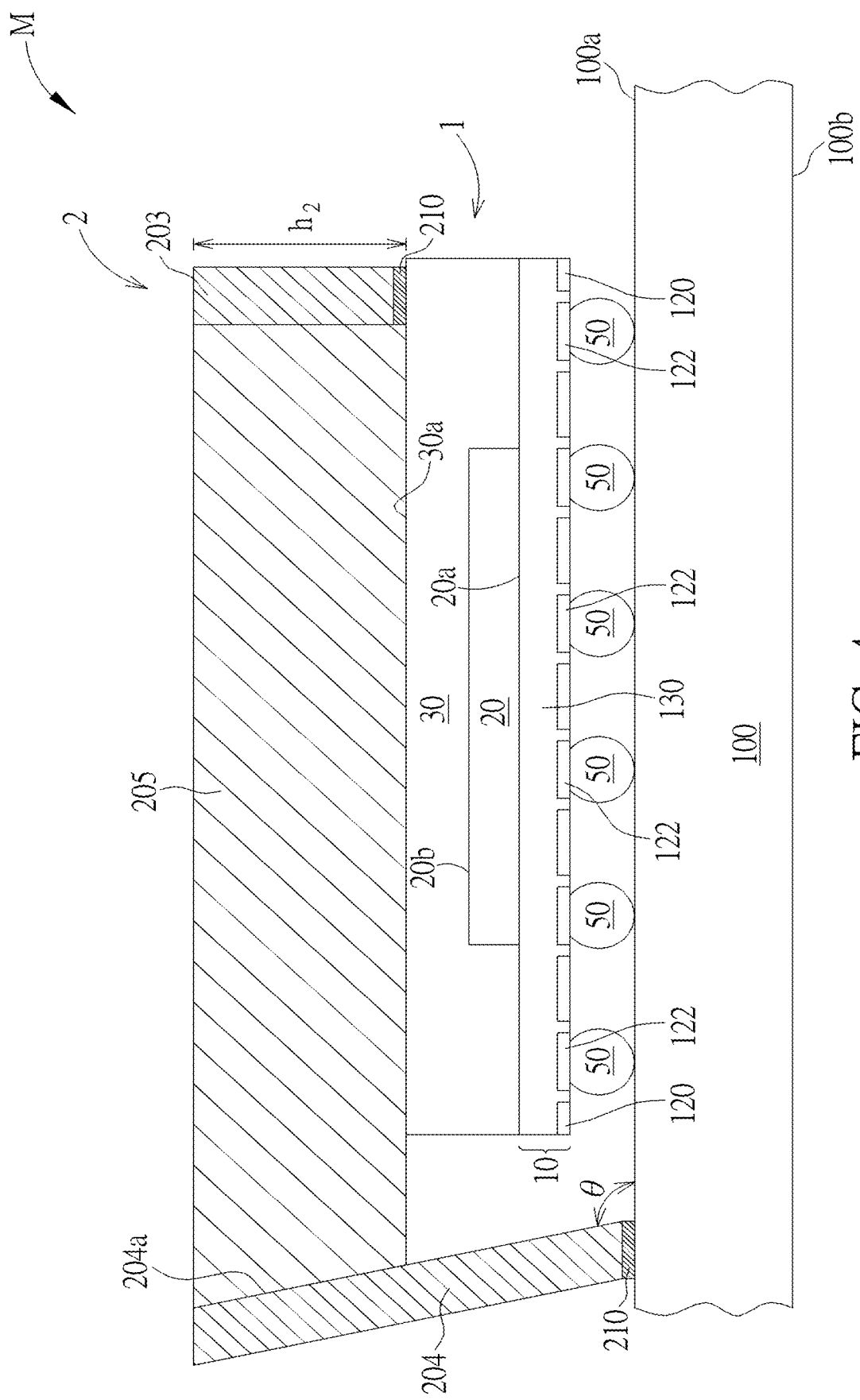
FIG. 4 is a schematic, cross-sectional view taken along line II-II' in FIG. 2.

Please refer to FIG. 1 to FIG. 4. FIG. 1 is a perspective diagram of an exemplary radar module according to one embodiment of the invention. FIG. 2 is a top view of the exemplary radar module in FIG. 1. FIG. 3 is a schematic, cross-sectional view taken along line I-I' in FIG. 2. FIG. 4 is a schematic, cross-sectional view taken along line II-II' in FIG. 2.

As shown in FIG. 1 to FIG. 4, the radar module M comprises a printed circuit board (PCB) 100 having a first surface 100a and a second surface 100b opposite to the first surface 100a. A semiconductor package 1 is mounted on the first surface 100a of the PCB 100. For the sake of simplicity, the wiring layers and interconnect elements in the printed circuit board 100 is not explicitly shown. It is understood that the PCB 100 may comprise a core layer or core substrate such as a copper clad laminate and a plurality of wiring layers and insulating layers laminated on the core layer. On the first surface 100a and the second surface 100b, solder masks (not explicitly shown) may be provided to protect the upper metal layer. Solder pads may be exposed by the solder pad openings formed in the solder mask for the connection with the semiconductor package 1 mounted on the first surface 100a.

According to one embodiment, the semiconductor package 1 may be an Antenna-in-Package (AiP), but is not limited thereto. As can be seen in FIG. 2 and FIG. 3, according to one embodiment of the invention, the semiconductor package 1 may comprise a substrate 10, an integrated circuit die 20 such as a radio frequency (RF) die disposed on the substrate 10, a molding compound 30 that is disposed on the substrate 10 and encapsulates the integrated circuit die 20, and a plurality of solder balls 50 disposed on a bottom surface of the substrate 10.

According to one embodiment of the invention, the substrate 10 may comprise an antenna layer 110, a ground reflector layer 120 under the antenna layer 110, and an insulating layer 130 between the antenna layer 110 and the ground reflector layer 120. The substrate 10 may further comprise a plurality of ball pads 122 for attaching the solder balls 50. According to one embodiment of the invention, the ball pads 122 and the ground reflector layer 120 are coplanar and are formed in the same metal layer of the substrate 10.

According to one embodiment of the invention, the antenna layer 110 and the ground reflector layer 120 are formed in two different metal layers (e.g., copper layers) of the substrate 10. The two metal layers are in different horizontal planes. For example, the substrate 10 may comprise an upper surface that is closer to the integrated circuit die 20 and a lower surface opposite to the upper surface. The antenna layer 110 may be formed at the upper surface and is therefore closer to the integrated circuit die 20. The antenna layer 110 may be electrically connected to the integrated circuit die 20 through an interconnect or a trace 112. The ground reflector layer 120, which may be electrically connected to a ground plane of the PCB 100, may be formed at the lower surface and is therefore closer to the PCB 100. Although not shown in the figures, it is to be understood that the metal layers in the substrate 10 may be interconnected through conductive vias if necessary.

According to one embodiment of the invention, the antenna layer 110 may comprise two rectangular-shaped antenna patterns 110a and 110b. The antenna pattern 110a is spaced apart from the antenna pattern 110b. According to one embodiment of the invention, for example, both of the antenna pattern 110a and the antenna pattern 110b may have dimension of about $(\lambda_g/2) \times (\lambda_g/2)$, wherein $\lambda_g$ is the guided wavelength of the electromagnetic radiation transmitted via the antenna layer 110, for example, a W-band radar, operating at 77 GHz, would have a $\lambda_g$=1.1~1.3 mm, wherein the substrate dielectric constant ($\varepsilon_r$) is about 3.6. Only for illustration purposes, the antenna pattern (transmit antenna) 110a may be used to transmit a send radar signal ($T_x$) and the antenna pattern (receive antenna) 110b may be used to receive a reflected radar signal ($R_x$).

It is to be understood that the antenna layer 110 can be realized by any type of antenna structure. In the illustrated embodiment of this disclosure, a patch antenna is selected due to its high gain and broadside radiation characteristics. According to other embodiments of the invention, the antenna layer 110 may be a phased-array antenna, a dipole antenna, a slot antenna, etc. According to one embodiment of the invention, the ground reflector layer 120 may be a solid metal layer such as a solid copper layer, which completely overlaps with the antenna layer 110 when viewed from the above.

According to one embodiment of the invention, the integrated circuit die 20 may be an integrated circuit (IC) silicon die or a semiconductor chip that comprises relative functional circuits for transmitting and/or receiving radar or RF signals. According to one embodiment of the invention, the integrated circuit die 20 may have an active surface 20a and a passive surface 20b that is opposite to the active surface 20a. A plurality of input/output (I/O) pads 210 may be disposed on the active surface 10a. According to one embodiment of the invention, the active surface 10a of the integrated circuit die 20 may be integrally joined with the upper surface of the substrate 10. The antenna layer 110 may be electrically connected to respective I/O pads 210 on the active surface 20a of the integrated circuit die 20 through the interconnect or the trace 112.

According to one embodiment of the invention, the molding compound 30 may comprise organic resin typically used in the encapsulation of integrated circuit devices and selected for low moisture permeability and low thermal coefficient of expansion to avoid exposure of the encapsulated chip to moisture or mechanical stress, respectively. For example, according to one embodiment of the invention, the molding compound 30 may comprise epoxy materials. The molding compound 30 may further comprise fillers, such as amorphous silicon oxide (silica glass) and/or crystalline silicon oxide (quartz) fillers. Suitable additives may be added to enhance the thermal conductivity of the molding compound 30. According to one embodiment of the invention, the molding compound 30 may have a dielectric constant k ranging between 3.3 and 3.4, for example. According to one embodiment of the invention, the molding compound 30 may have a thickness of about 1.1—1.3 mm, for example, 1.2 mm, but is not limited thereto.

According to one embodiment of the invention, for example, the semiconductor package 1 may be a fan-out wafer level package (FOWLP) and the substrate 10 may be a re-distribution layer (RDL) substrate. As known in the art, wafer level package (WLP) involves packaging the die while it is still on the wafer. Generally, WLP is a substrateless package. Instead of a substrate, WLP utilizes a thin-film of routing layers, or redistribution layers (RDLs), which provide electrical connections in the package. WLP makes use of solder balls 50 on the bottom of the package, which connects the RDLs to a board or a printed circuit board (PCB).

According to one embodiment of the invention, the radar module M further comprises a discrete pattern-shaping device 2 is externally and directly mounted on the first surface 100a of the PCB 100 and on a top surface 30a of the molding compound 30 of the semiconductor package 1 by using an adhesive layer 210 or the like. According to one embodiment of the invention, the pattern-shaping device 2 is preferably a monolithic piece that is made of a homogeneous material. For example, the pattern-shaping device 2 may be made of metal, plastic, mmW absorber materials, or any suitable materials capable of implementing radiation pattern shaping of radar signals. According to one embodiment of the invention, the pattern-shaping device 2 may be made of copper, but is not limited thereto.

According to one embodiment of the invention, the pattern-shaping device 2 may comprise four sidewalls 201~204 and an intermediate isolation wall 205, which together define two compartments or channels $C_a$ and $C_b$ above the semiconductor package 1. According to one embodiment of the invention, the channel $C_a$ is aligned with the antenna pattern (transmit antenna) 110a and the channel $C_b$ is aligned with the antenna pattern (receive antenna) 110b. In some embodiments, the intermediate isolation wall 205 is optional and may be omitted.

According to one embodiment of the invention, the two opposite sidewalls 201 and 202 are vertical sidewalls, which protrude and extend vertically from the first surface 100a of the PCB 100. The two opposite sidewalls 201 and 202 are in parallel with the reference XZ plane. According to one embodiment of the invention, the two opposite sidewalls 201 and 202 are fixed to the first surface 100a of the PCB 100 and have a height $h_1$ approximately ranging between 4 and 12 mm, but is not limited thereto.

The intermediate isolation wall 205 is in parallel with the sidewalls 201 and 202 and is interposed between the sidewalls 201 and 202. The intermediate isolation wall 205 partially overlaps with the underlying semiconductor package 1. According to one embodiment of the invention, the intermediate isolation wall 205 is a vertical wall, which protrudes and extends vertically from the top surface 30a of the molding compound 30 of the semiconductor package 1. According to one embodiment of the invention, the intermediate isolation wall 205 has a height $h_2$ approximately ranging between 3 and 12 mm, which is not limited thereto, from the top surface 30a of the molding compound 30.

According to one embodiment of the invention, the sidewall 203 is a vertical sidewall, which preferably protrudes and extends vertically from the top surface 30a of the molding compound 30 of the semiconductor package 1. The sidewall 203 is in parallel with the reference YZ plane and is integrally connected to the sidewalls 201 and 202 and the intermediate isolation wall 205 at a right angle.

According to one embodiment of the invention, the sidewall 204, which is opposite to the sidewall 203, is an oblique sidewall. The oblique sidewall may be used to expand the field distribution of the antenna, making the field distribution more uniform. The sidewall 204 provides an inner slope 204a directly facing the semiconductor package 1. The inner slope 204a intersects with the first surface 100a of the PCB 100 at an obtuse angle θ. According to one embodiment of the invention, the obtuse angle θ may range between 110 degrees and 160 degrees, depending upon the design requirements. The sidewall 204 is integrally connected to the sidewalls 201 and 202 and the intermediate isolation wall 205.

Figure 5:
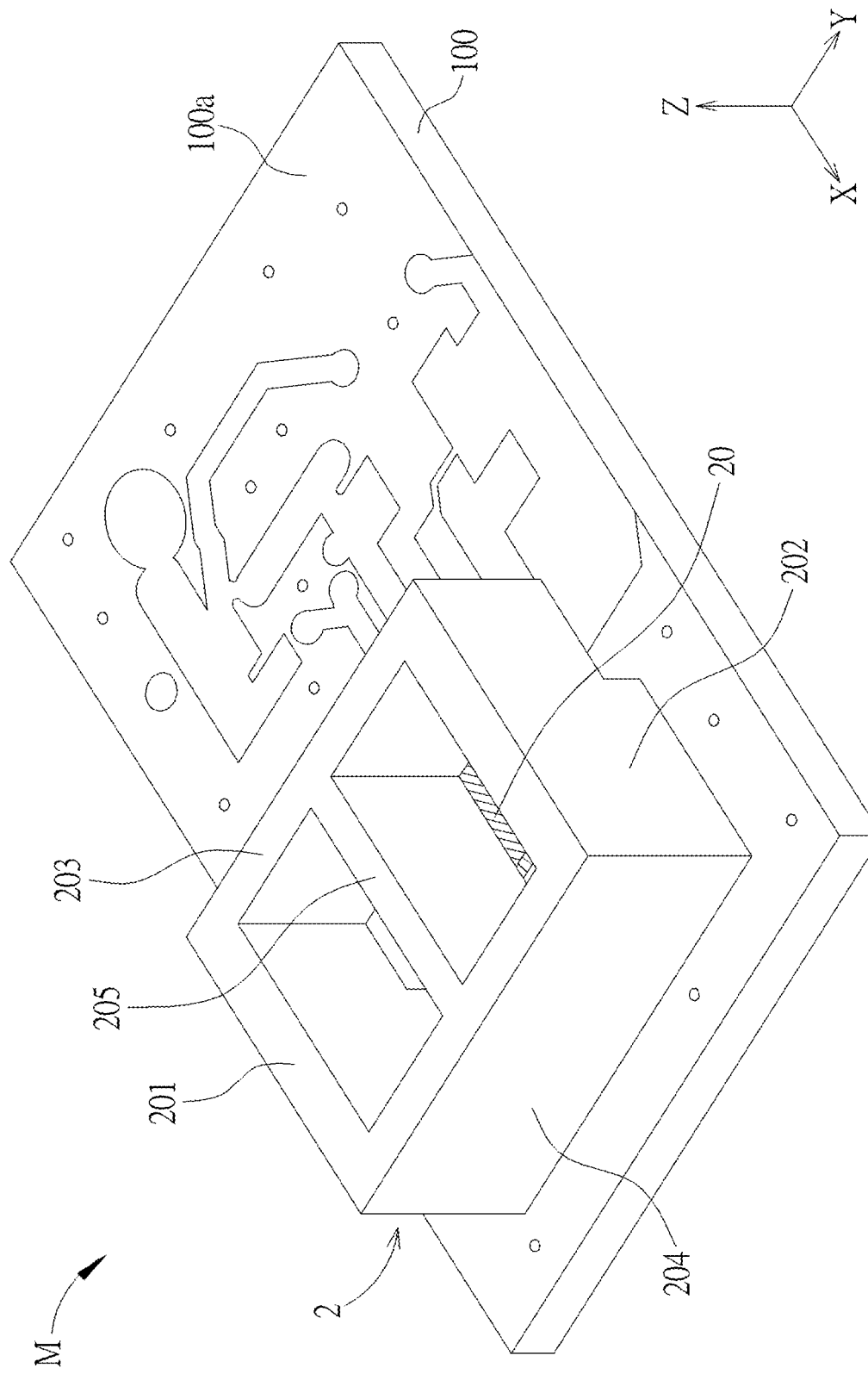
FIG. 5 to FIG. 12 are schematic, perspective diagrams showing various pattern-shaping devices according to various embodiments of the invention.

FIG. 5 is a schematic, perspective diagrams illustrating an exemplary radar module with a pattern-shaping device according to another embodiment of the invention, wherein like regions, layers or elements are designated by like numeral numbers. As shown in FIG. 5, the discrete pattern-shaping device 2 is externally and directly mounted on the first surface 100a of the PCB 100 and on a top surface 30a of the molding compound 30 of the semiconductor package 1. According to the illustrated embodiment, the pattern-shaping device 2 is preferably a monolithic piece that is made of a homogeneous material. For example, the pattern-shaping device 2 may be made of metal, plastic, mmW absorber materials, or any suitable materials capable of implementing radiation pattern shaping of radar signals.

According to the illustrated embodiment, the pattern-shaping device 2 may be made of copper, but is not limited thereto. According to the illustrated embodiment, the pattern-shaping device 2 comprises four sidewalls 201~204 and an intermediate isolation wall 205. According to the illustrated embodiment, the two opposite sidewalls 201 and 202 are vertical sidewalls, which protrude and extend vertically from the first surface 100a of the PCB 100. The two opposite sidewalls 201 and 202 are in parallel with the reference XZ plane. The two opposite sidewalls 203 and 204 are vertical sidewalls. The sidewall 203 protrudes and extends vertically from the top surface 30a of the molding compound 30 of the semiconductor package 1. The sidewall 204 protrudes and extends vertically from the first surface 100a of the PCB 100. The sidewalls 203 and 204 are in parallel with the reference YZ plane and are integrally connected to the sidewalls 201 and 202 and the intermediate isolation wall 205 at a right angle. The opening 200 defined by the four vertical sidewalls 201~204 completely overlaps with the antenna patterns in the antennal layer of the semiconductor package 1 when viewed from the above. It is to be understood that the pattern-shaping device 2 may be made of hybrid materials. For example, only two sidewalls are made of copper, while the rest sidewalls are made of absorber.

Figure 6:
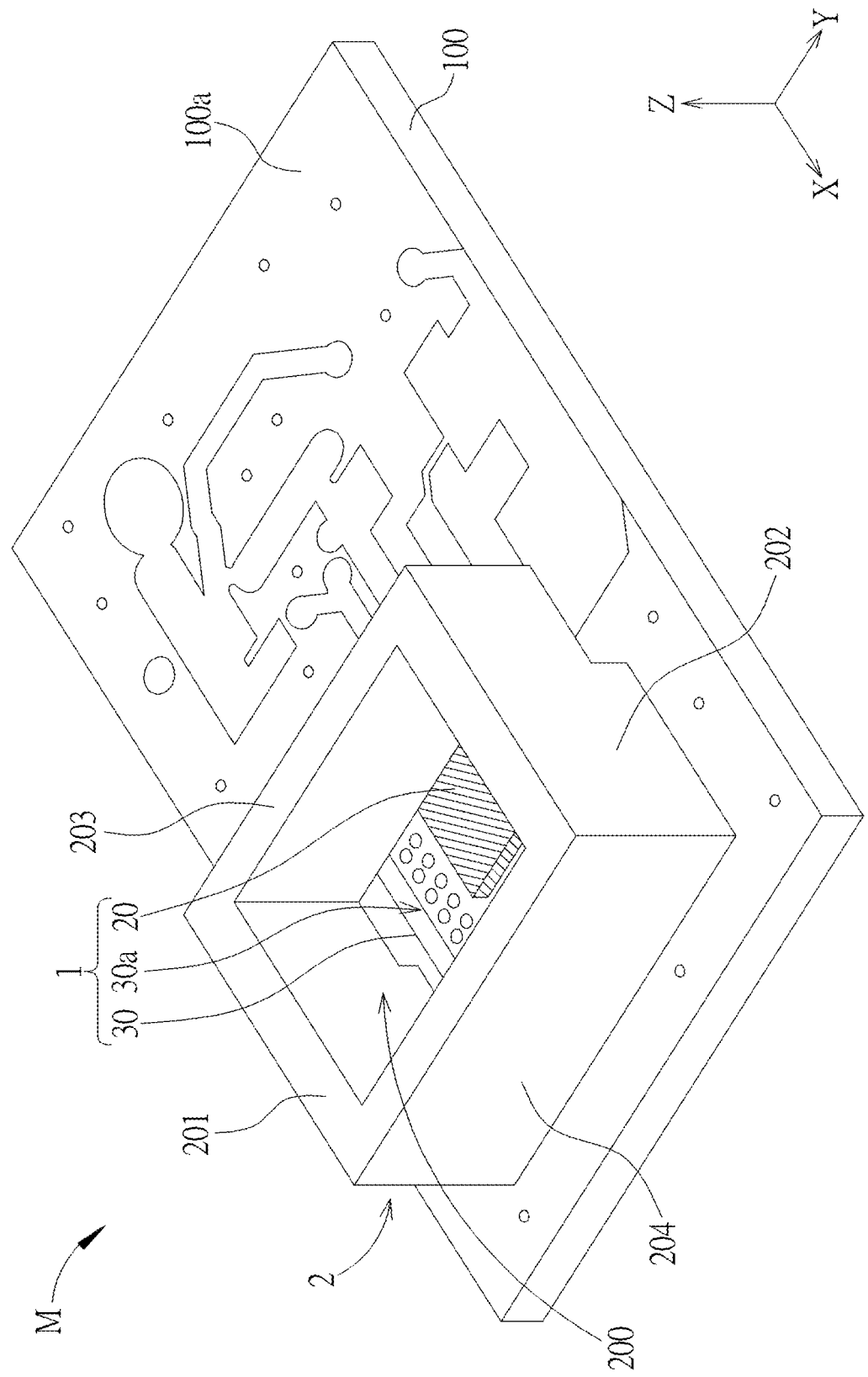

FIG. 6 is a schematic, perspective diagrams illustrating an exemplary radar module with a pattern-shaping device according to another embodiment of the invention, wherein like regions, layers or elements are designated by like numeral numbers. As shown in FIG. 6, the discrete pattern-shaping device 2 is externally and directly mounted on the first surface 100a of the PCB 100 and on a top surface 30a of the molding compound 30 of the semiconductor package 1. According to the illustrated embodiment, the pattern-shaping device 2 is preferably a monolithic piece that is made of a homogeneous material. For example, the pattern-shaping device 2 may be made of metal, plastic, mmW absorber materials, or any suitable materials capable of implementing radiation pattern shaping of radar signals. According to the illustrated embodiment, the pattern-shaping device 2 may be made of copper, but is not limited thereto. According to the illustrated embodiment, the pattern-shaping device 2 comprises only four sidewalls 201~204. The intermediate isolation wall 205 as depicted in FIG. 1 and FIG. 2 is omitted. According to the illustrated embodiment, the two opposite sidewalls 201 and 202 are vertical sidewalls, which protrude and extend vertically from the first surface 100a of the PCB 100. The two opposite sidewalls 201 and 202 are in parallel with the reference XZ plane. The two opposite sidewalls 203 and 204 are vertical sidewalls. The sidewall 203 protrudes and extends vertically from the top surface 30a of the molding compound 30 of the semiconductor package 1. The sidewall 204 protrudes and extends vertically from the first surface 100a of the PCB 100. The sidewalls 203 and 204 are in parallel with the reference YZ plane and are integrally connected to the sidewalls 201 and 202 at a right angle. The opening 200 defined by the four vertical sidewalls 201~204 completely overlaps with the antenna patterns in the antennal layer of the semiconductor package 1 when viewed from the above.

Figure 7:
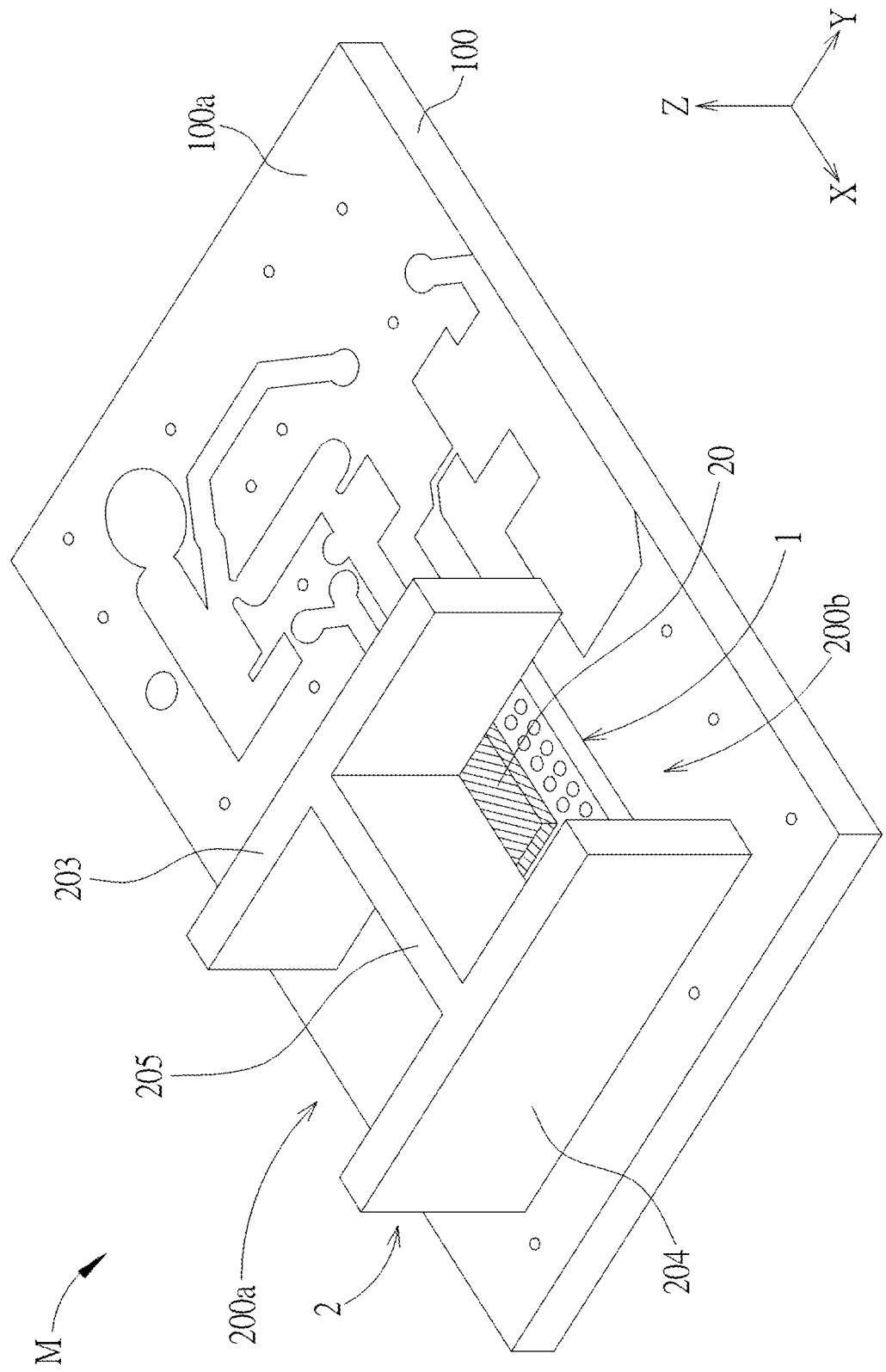

FIG. 7 is a schematic, perspective diagrams illustrating an exemplary radar module with a pattern-shaping device according to another embodiment of the invention, wherein like regions, layers or elements are designated by like numeral numbers. As shown in FIG. 7, the discrete pattern-shaping device 2 is externally and directly mounted on the first surface 100a of the PCB 100 and on the semiconductor package 1. According to the illustrated embodiment, the pattern-shaping device 2 is preferably a monolithic piece that is made of a homogeneous material. For example, the pattern-shaping device 2 may be made of metal, plastic, mmW absorber materials, or any suitable materials capable of implementing radiation pattern shaping of radar signals. According to the illustrated embodiment, the pattern-shaping device 2 may be made of copper, but is not limited thereto. According to the illustrated embodiment, the pattern-shaping device 2 comprises two sidewalls 203 and 204 and an intermediate isolation wall 205 integrally connecting to the two sidewalls 203 and 204 at t a right angle. According to the illustrated embodiment, the two opposite sidewalls 203 and 204 are vertical sidewalls. The sidewall 203 protrudes and extends vertically from the top surface 30a of the molding compound 30 of the semiconductor package 1. The sidewall 204 protrudes and extends vertically from the first surface 100a of the PCB 100. The sidewalls 203 and 204 are in parallel with the reference YZ plane. The two open-ended cubicles 200a and 200b defined by the vertical sidewalls 203 and 204 and the intermediate isolation wall 205 are aligned with the antenna patterns in the semiconductor package 1, respectively.

Figure 8:
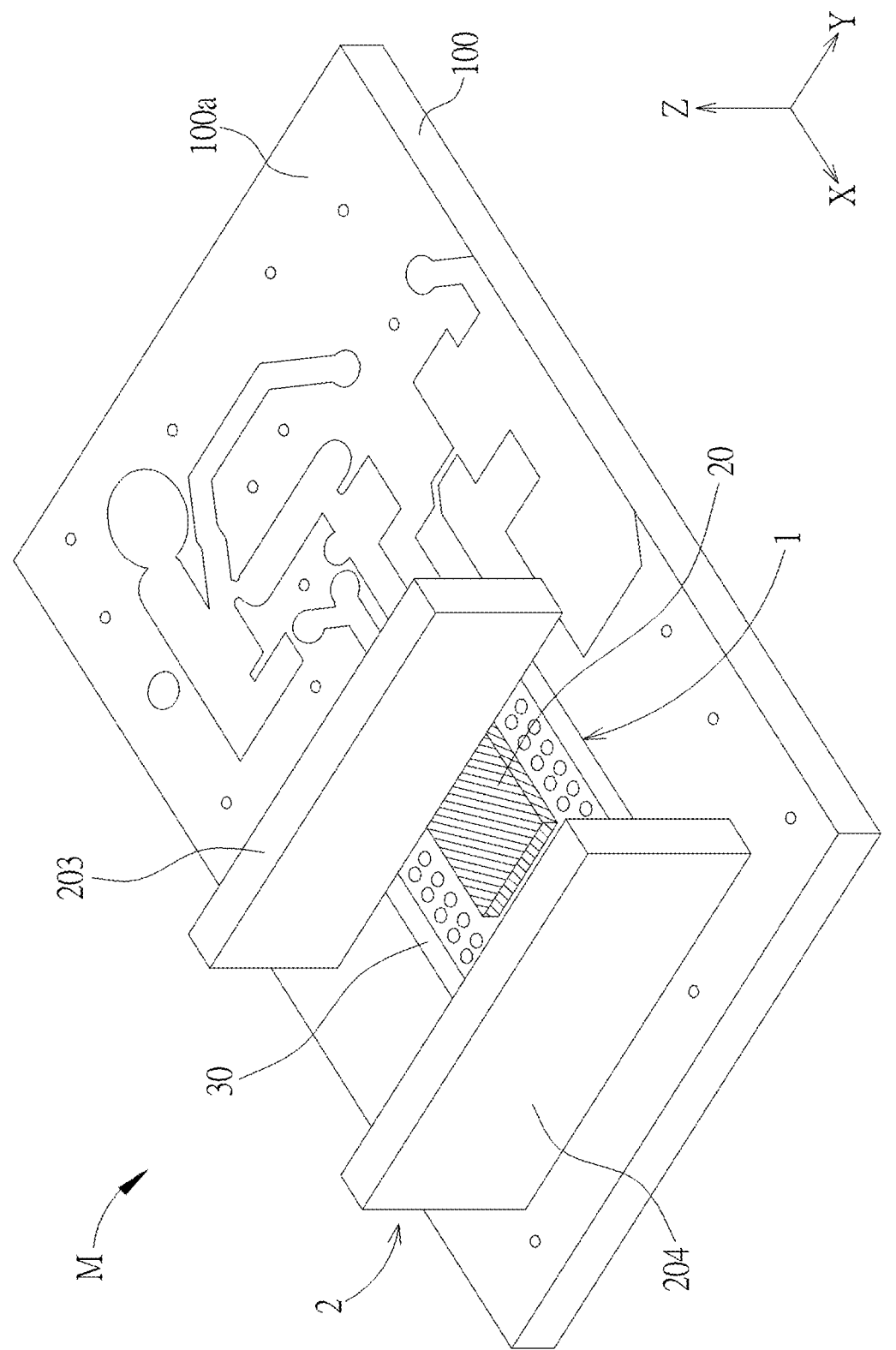

FIG. 8 is a schematic, perspective diagrams illustrating an exemplary radar module with a pattern-shaping device according to still another embodiment of the invention, wherein like regions, layers or elements are designated by like numeral numbers. As shown in FIG. 8, the discrete pattern-shaping device 2 is externally and directly mounted on the first surface 100a of the PCB 100 and on the semiconductor package 1. According to the illustrated embodiment, the pattern-shaping device 2 is preferably made of a homogeneous material. For example, the pattern-shaping device 2 may be made of metal, plastic, mmW absorber materials, or any suitable materials capable of implementing radiation pattern shaping of radar signals. According to the illustrated embodiment, the pattern-shaping device 2 may be made of copper, but is not limited thereto. According to the illustrated embodiment, the pattern-shaping device 2 comprises only two sidewalls 203 and 204. According to the illustrated embodiment, the two opposite sidewalls 203 and 204 are vertical sidewalls. The sidewall 203 protrudes and extends vertically from the top surface 30a of the molding compound 30 of the semiconductor package 1. The sidewall 204 protrudes and extends vertically from the first surface 100a of the PCB 100. The sidewalls 203 and 204 are in parallel with the reference YZ plane.

Figure 9:
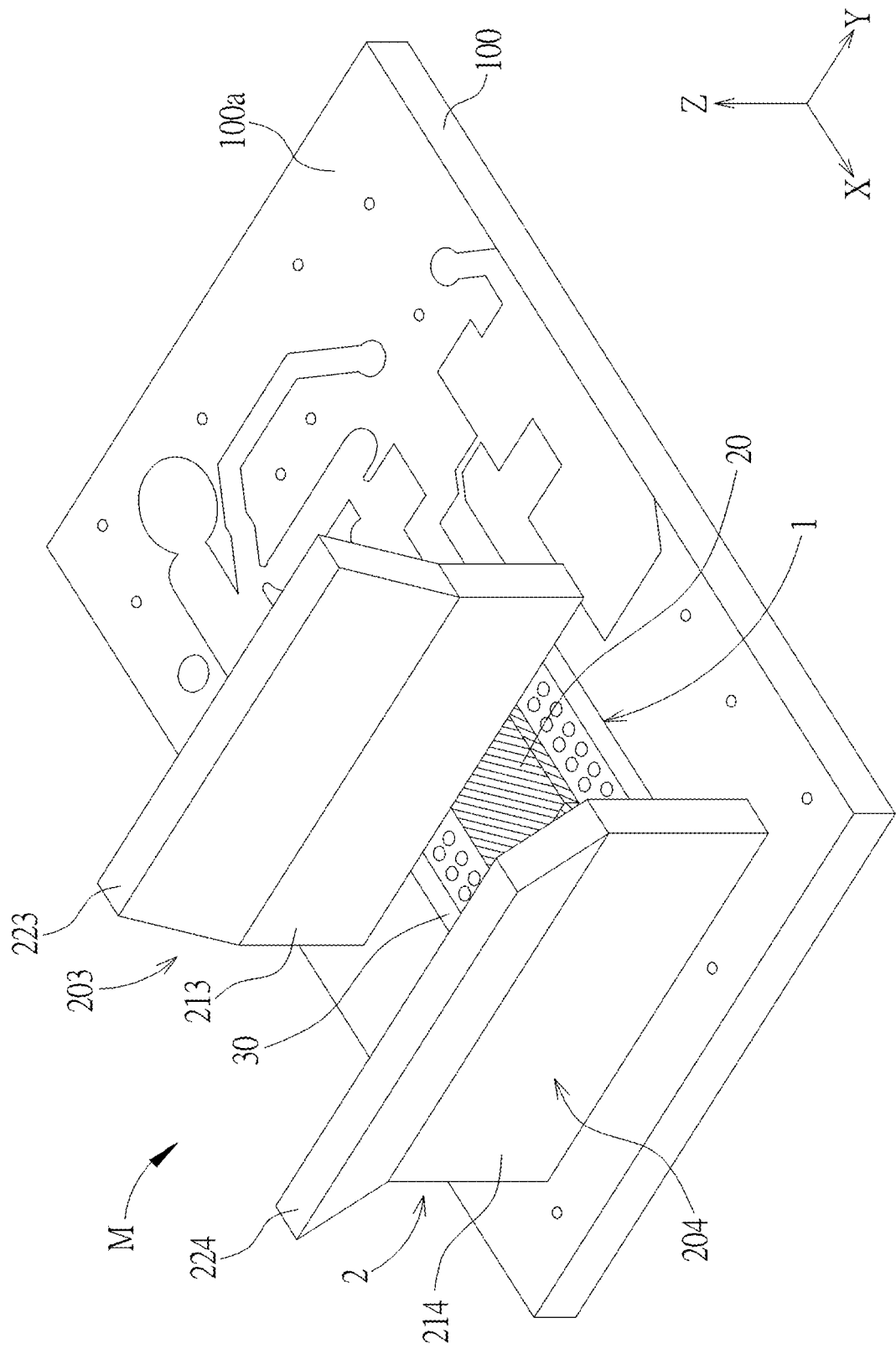

FIG. 9 is a schematic, perspective diagrams illustrating an exemplary radar module with a pattern-shaping device according to still another embodiment of the invention, wherein like regions, layers or elements are designated by like numeral numbers. As shown in FIG. 9, the pattern-shaping device 2 comprises only two sidewalls 203 and 204. According to the illustrated embodiment, the sidewall 203 comprises a vertical sidewall 213 and an oblique sidewall 223 integrally connected to the vertical sidewall 213, and the sidewall 204 comprises a vertical sidewall 214 and an oblique sidewall 224 integrally connected to the vertical sidewall 214. The sidewall 213 protrudes and extends vertically from the top surface 30a of the molding compound 30 of the semiconductor package 1. The sidewall 214 protrudes and extends vertically from the first surface 100a of the PCB 100. The sidewalls 213 and 214 are in parallel with the reference YZ plane. The oblique sidewalls 223 and 224 may be used to expand the field distribution of the antenna, making the field distribution more uniform.

Figure 10:
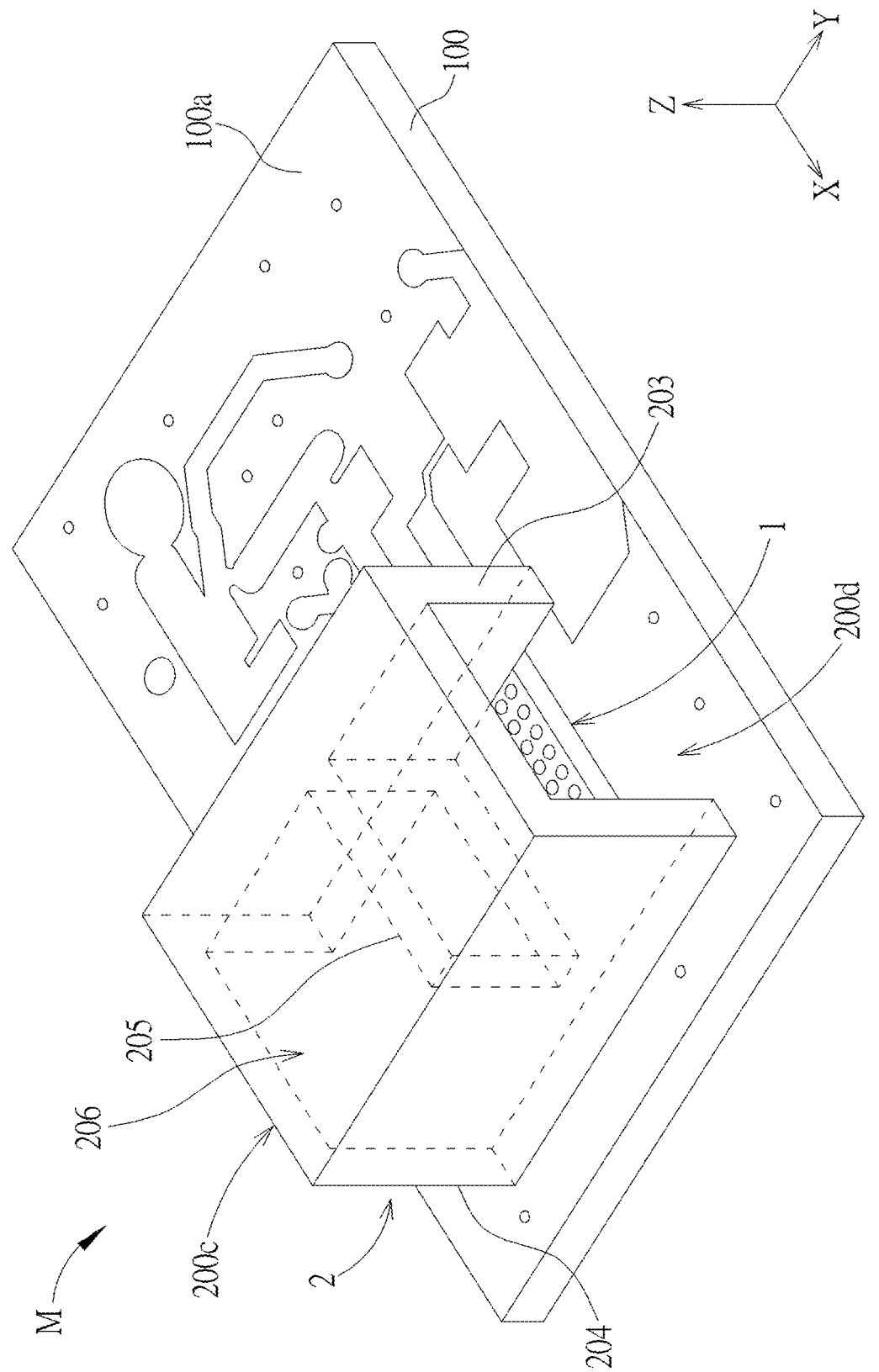

FIG. 10 is a schematic, perspective diagrams illustrating an exemplary radar module with a pattern-shaping device according to still another embodiment of the invention, wherein like regions, layers or elements are designated by like numeral numbers. As shown in FIG. 10, the discrete pattern-shaping device 2 is externally and directly mounted on the first surface 100a of the PCB 100 and on the semiconductor package 1. The discrete pattern-shaping device 2 in FIG. 10 is similar to that as depicted in FIG. 7. The difference between the discrete pattern-shaping device 2 in FIG. 10 and the discrete pattern-shaping device 2 in FIG. 7 is that the discrete pattern-shaping device 2 in FIG. 10 includes a ceiling 206. The two sidewalls 203 and 204 and the intermediate isolation wall 205 integrally connecting to the two sidewalls 203 and 204 at t a right angle form two opposite openings 200c and 200d oriented along the reference Y axis.

Figure 11:
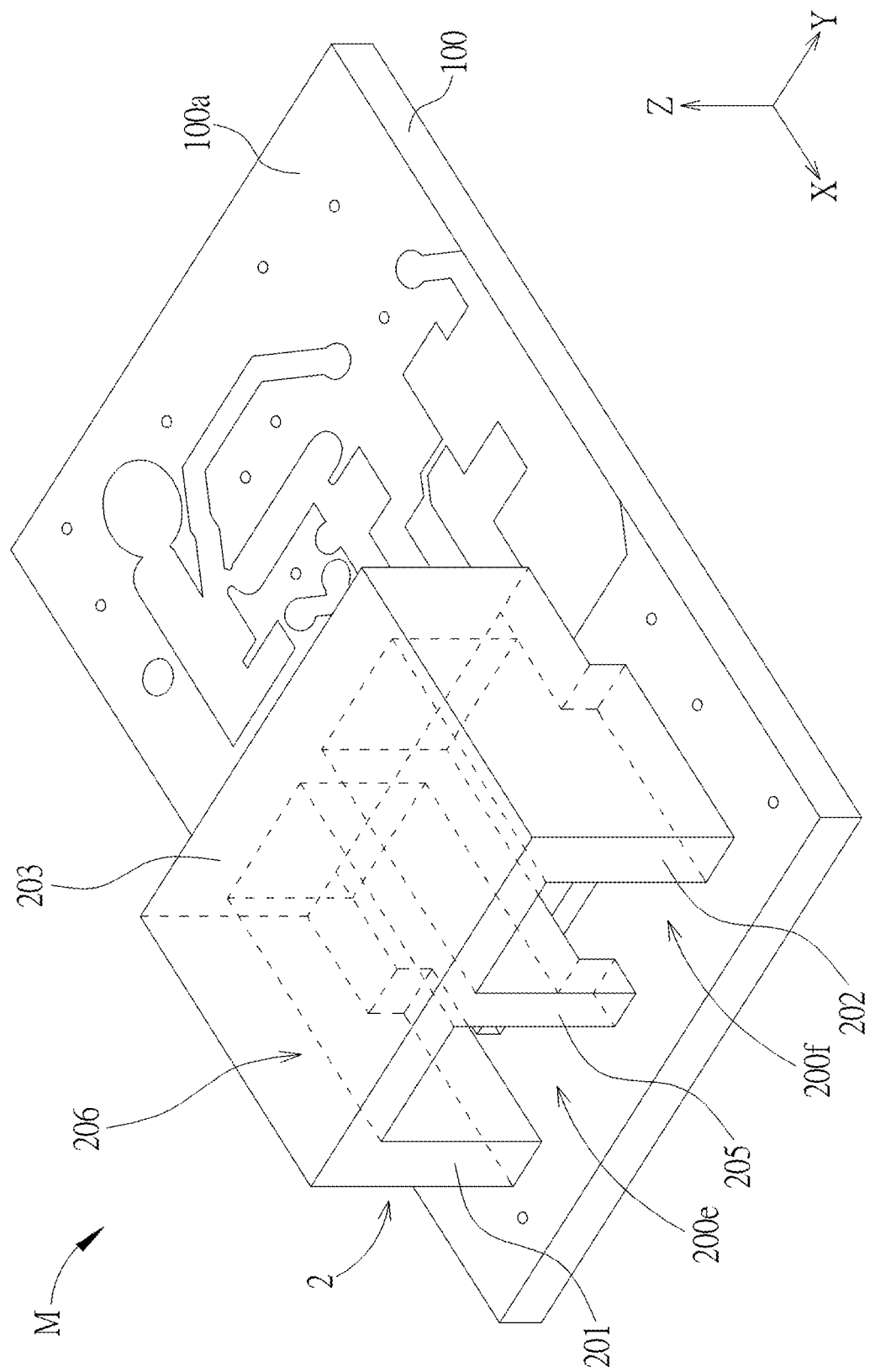

FIG. 11 is a schematic, perspective diagrams illustrating an exemplary radar module with a pattern-shaping device according to still another embodiment of the invention, wherein like regions, layers or elements are designated by like numeral numbers. As shown in FIG. 11, the discrete pattern-shaping device 2 is externally and directly mounted on the first surface 100a of the PCB 100 and on the semiconductor package 1. The discrete pattern-shaping device 2 in FIG. 11 is similar to that as depicted in FIG. 10. The difference between the discrete pattern-shaping device 2 in FIG. 10 and the discrete pattern-shaping device 2 in FIG. 10 is that the discrete pattern-shaping device 2 in FIG. 11 has two parallel openings 200e and 200f oriented along the reference X axis. The two parallel openings 200e and 200f are defined by the sidewalls 201, 202, 203, the intermediate isolation wall 205, and the ceiling 206.

Figure 12:
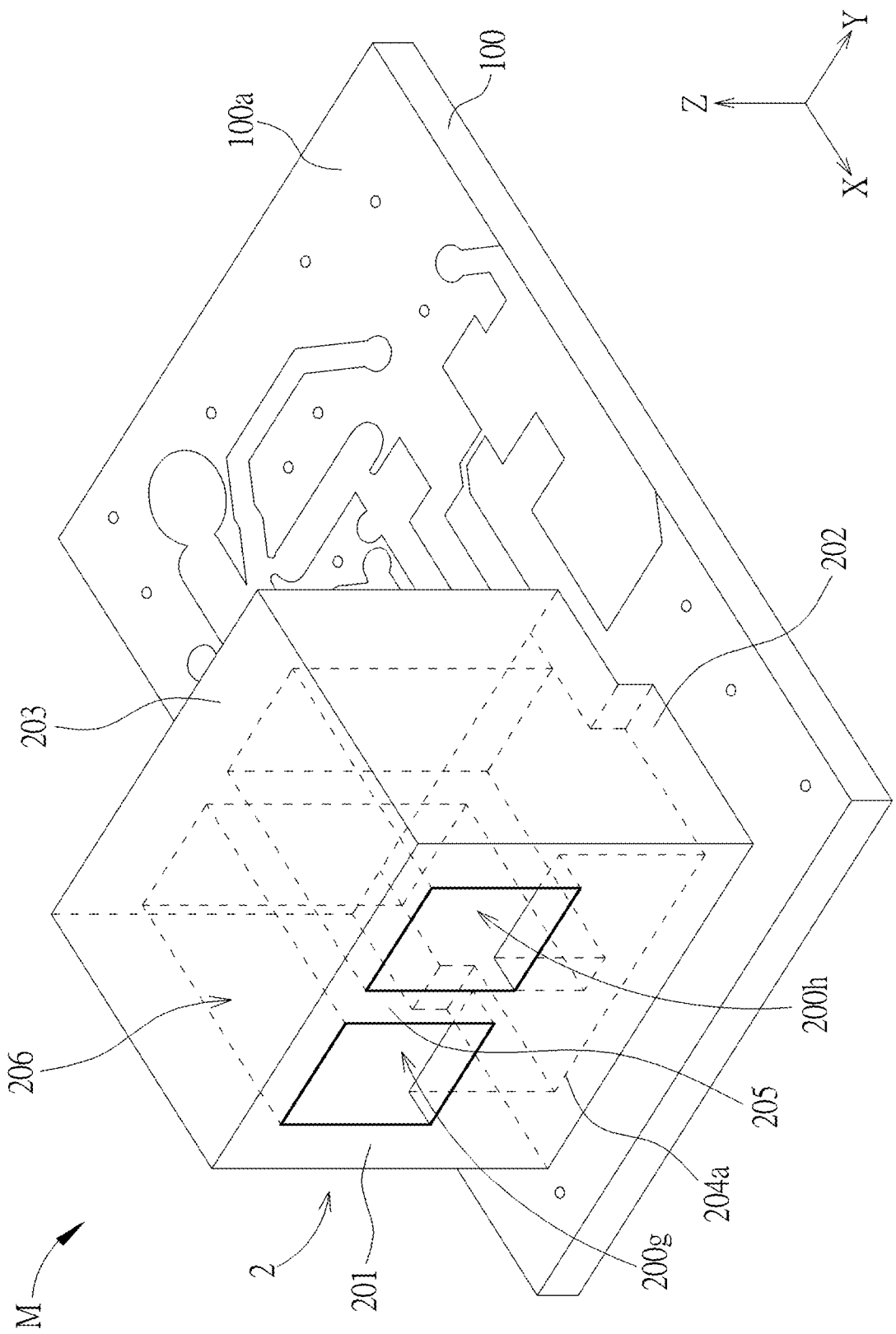

FIG. 12 is a schematic, perspective diagrams illustrating an exemplary radar module with a pattern-shaping device according to yet another embodiment of the invention, wherein like regions, layers or elements are designated by like numeral numbers. As shown in FIG. 12, the discrete pattern-shaping device 2 is externally and directly mounted on the first surface 100a of the PCB 100 and on the semiconductor package 1. The discrete pattern-shaping device 2 in FIG. 12 is similar to that as depicted in FIG. 11. The difference between the discrete pattern-shaping device 2 in FIG. 12 and the discrete pattern-shaping device 2 in FIG. 11 is that the discrete pattern-shaping device 2 in FIG. 12 has two parallel, elevated openings 200g and 200h oriented along the reference X axis. The two parallel, elevated openings 200g and 200h are defined by the sidewalls 201, 202, 203, the intermediate isolation wall 205, the sidewall 204a, and the ceiling 206. The sidewall 204a has a smaller height, as shown in FIG. 12.

Please refer to FIG. 13 to FIG. 16. FIG. 13 to FIG. 16 are schematic, cross-sectional diagrams illustrating some exemplary radar modules with various shapes of the pattern-shaping device according to other embodiments of the invention, wherein like regions, layers or elements are designated by like numeral numbers.

Figure 13:
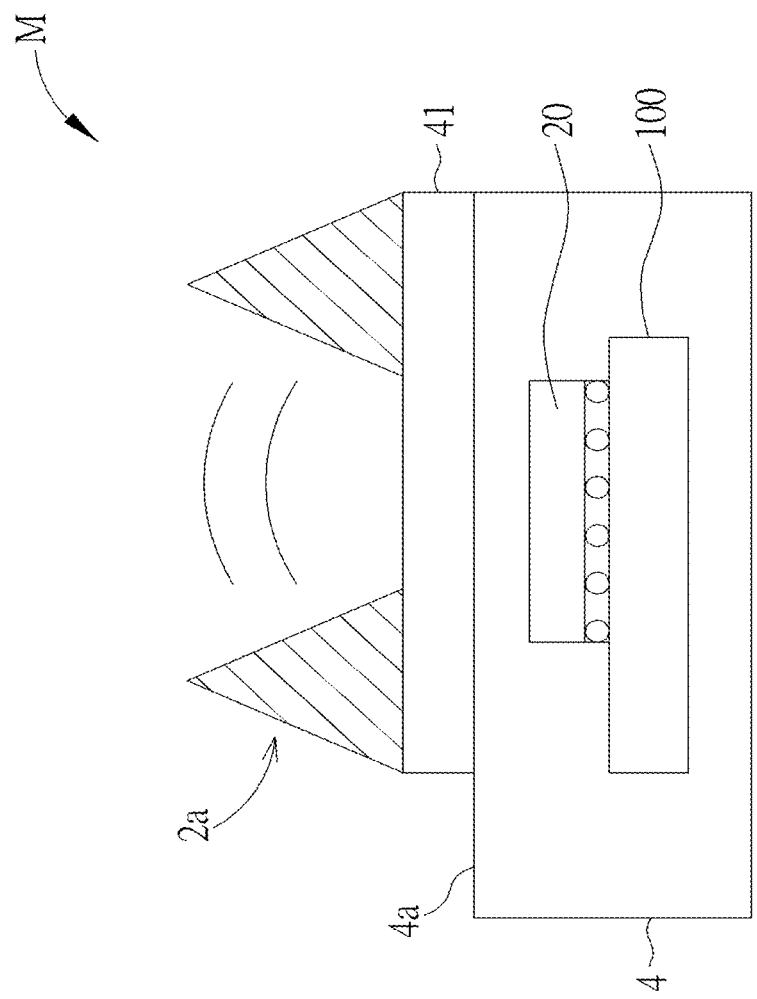
FIG. 13 to FIG. 16 are schematic, cross-sectional diagrams showing some exemplary radar modules with various shapes of the pattern-shaping device according to other embodiments of the invention.
Figure 14:
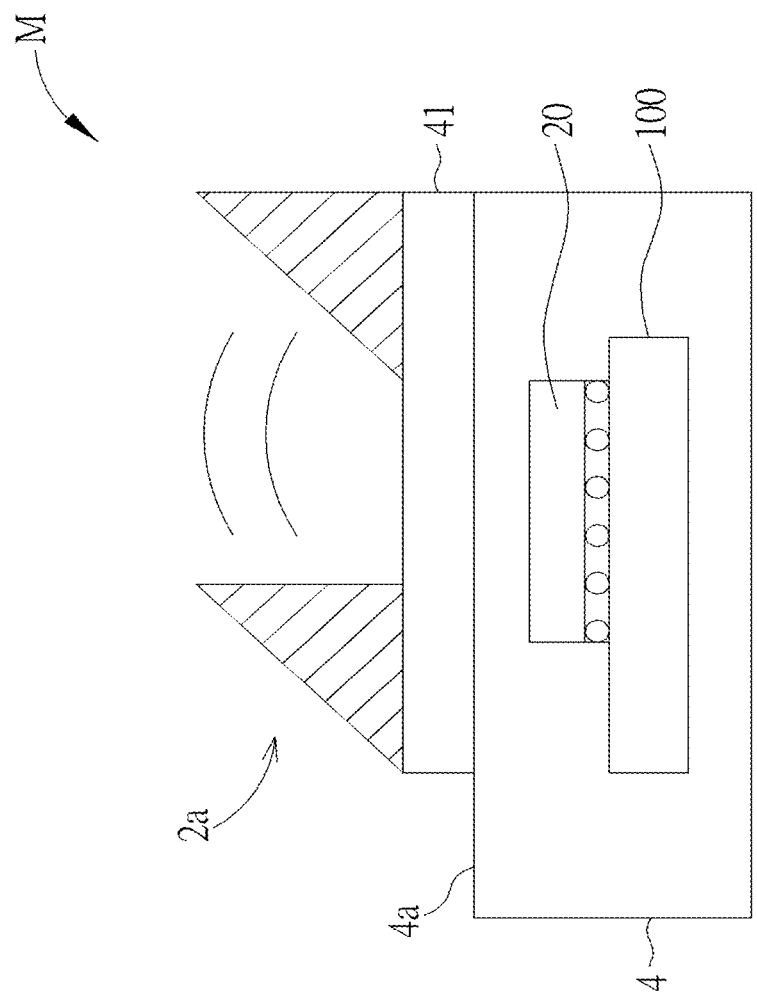
Figure 15:
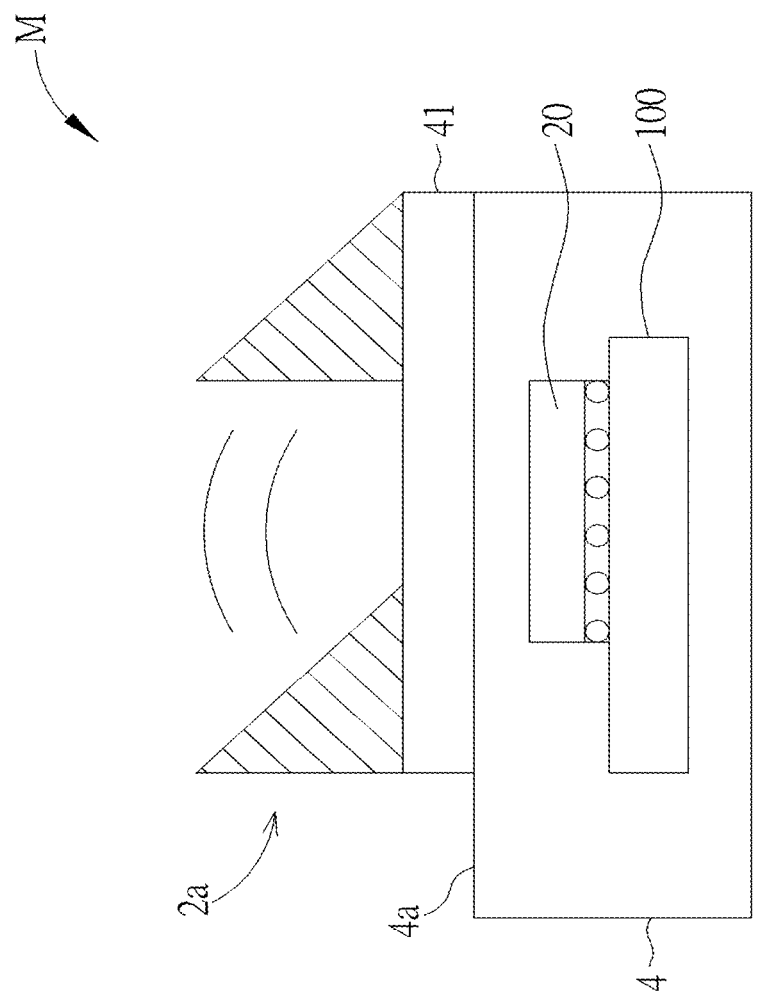
Figure 16:
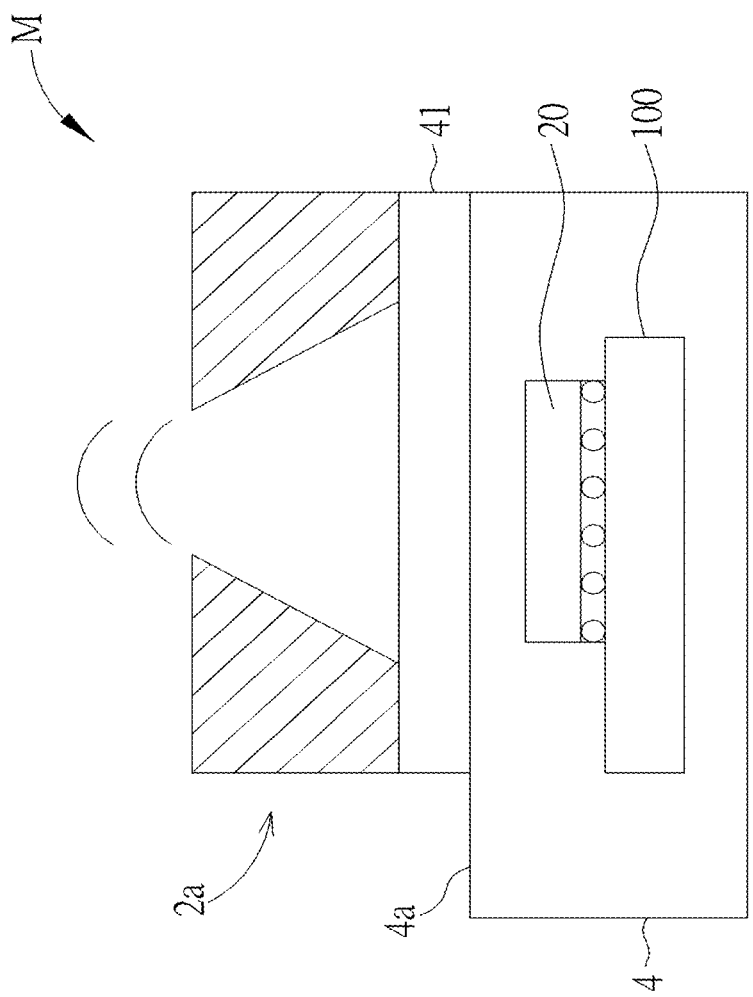

As shown in FIG. 13 to FIG. 16, the radar module M may further comprise a radar main body 4 housing the PCB 100 and the semiconductor package 20 that is mounted on the PCB 100. The details of the PCB 100 and the semiconductor package 20 are disclosed as alluded to above. According to one embodiment of the invention, the radar main body 4 may have a transmission surface or a reception surface 4a provided at one surface of the body 4 to transmit or receive radio waves or radar signals. For example, the radar main body 4 may comprise a retainer 41 at the surface 4a. A pattern-shaping device 2a having sidewalls with a triangle sectional profile may be mounted on the retainer 41. For example, FIG. 13 shows that the pattern-shaping device 2a may have a sectional profile with an equilateral or isosceles triangle shape. For example, FIG. 14 and FIG. 15 show that the pattern-shaping device 2a may have a sectional profile with a right-angled triangle shape. For example, FIG. 16 shows that the pattern-shaping device 2a may have a sectional profile with a trapezoid shape.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A radio frequency module, comprising:
a base having a first surface and a second surface opposite to the first surface;
a semiconductor package mounted on the first surface of the base, wherein the semiconductor package comprises an integrated circuit die and a substrate for electrically connecting the integrated circuit die to the base, wherein the substrate comprises an antenna layer integrated into the semiconductor package and electrically connected to the integrated circuit die for at least one of transmitting and receiving radio frequency signals; and
a pattern-shaping device mounted on the first surface of the base configured to shape a radiation pattern of the radio frequency signals,
wherein the pattern-shaping device comprises:
a plurality of sidewalls including a first sidewall, a second sidewall, a third sidewall a fourth sidewall; and
an intermediate isolation wall,
wherein the plurality of sidewalls and the intermediate isolation wall together define first and second channels for the radio frequency signals, the first and second channels extending above the semiconductor package.

2. The radio frequency module according to claim 1, wherein the semiconductor package further comprises a molding compound encapsulating the integrated circuit die.

3. The radio frequency module according to claim 2, wherein the pattern-shaping device is a discrete device directly mounted on the first surface of the base and a top surface of the molding compound of the semiconductor package.

4. The radio frequency module according to claim 1, wherein the pattern-shaping device is a monolithic piece that is made of a homogeneous material.

5. The radio frequency module according to claim 1, wherein the pattern-shaping device is made of metal, plastic or mmW absorber material.

6. The radio frequency module according to claim 1, wherein the substrate further comprises a ground reflector layer under the antenna layer.

7. The radio frequency module according to claim 6, wherein the ground reflector layer is a metal layer.

8. The radio frequency module according to claim 1, wherein the first sidewall is an oblique sidewall.

9. The radio frequency module according to claim 8, wherein the oblique sidewall provides an inner slope directly facing the semiconductor package, wherein the inner slope intersects with the first surface of the base at an obtuse angle ranging between 110 degrees and 160 degrees.

10. A radio frequency module, comprising:
a base having a first surface and a second surface opposite to the first surface;
a semiconductor package mounted on the first surface of the base, wherein the semiconductor package comprises an integrated circuit die and a substrate for electrically connecting the integrated circuit die to the base, wherein the substrate comprises an antenna layer integrated into the semiconductor package and electrically connected to the integrated circuit die for at least one of transmitting and receiving radio frequency signals;
a radio frequency main body housing the base and the semiconductor package, the radio frequency main body comprising a retainer; and
a pattern-shaping device mounted on the retainer configured to shape a radiation pattern of said radio frequency signals,
wherein the pattern-shaping device comprises:
a plurality of sidewalls including a first sidewall, a second sidewall, a third sidewall and a fourth sidewall;
an intermediate isolation wall,
wherein the plurality of sidewalls and the intermediate isolation wall together define first and second channels for the radio frequency signals, the first and second channels extending above the semiconductor package.

11. The radio frequency module according to claim 10, wherein the pattern-shaping device is a monolithic piece that is made of a homogeneous material.

12. The radio frequency module according to claim 10, wherein the pattern-shaping device is made of metal, plastic or mmW absorber material.

13. The radio frequency module of claim 1, wherein the radio frequency signals are radar signals.

14. The radio frequency module of claim 10, wherein the radio frequency signals are radar signals.

* * * * *